(12) United States Patent
Loo et al.

(10) Patent No.: US 10,476,018 B2
(45) Date of Patent: Nov. 12, 2019

(54) SING-JUNCTION ORGANIC PHOTOVOLTAIC DEVICES HAVING HIGH OPEN-CIRCUIT VOLTAGES AND APPLICATIONS THEREOF

(71) Applicant: The Trustees of Princeton University, Princeton, NJ (US)

(72) Inventors: Yueh-Lin Loo, Princeton, NJ (US); Nicholas C. Davy, Princeton, NJ (US); Melda Sezen Edmonds, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 128 days.

(21) Appl. No.: 15/577,965

(22) PCT Filed: Dec. 19, 2016

(86) PCT No.: PCT/US2016/067576
§ 371 (c)(1),
(2) Date: Nov. 29, 2017

(87) PCT Pub. No.: WO2017/106852
PCT Pub. Date: Jun. 22, 2017

(65) Prior Publication Data
US 2018/0175313 A1 Jun. 21, 2018

Related U.S. Application Data

(60) Provisional application No. 62/269,609, filed on Dec. 18, 2015.

(51) Int. Cl.
*G02F 1/15* (2019.01)
*H01L 51/42* (2006.01)
(Continued)

(52) U.S. Cl.
CPC ............. *H01L 51/424* (2013.01); *C09K 9/00* (2013.01); *C09K 9/02* (2013.01); *G02F 1/153* (2013.01);
(Continued)

(58) Field of Classification Search
CPC ...... G02F 1/163; G02F 1/153; G02F 1/15165; G02F 2001/1502
See application file for complete search history.

(56) References Cited

U.S. PATENT DOCUMENTS 8,183,082 B1   5/2012  Lewis et al.
2005/0061364 A1* 3/2005 Peumans ............ H01L 51/0026
                                                    136/263
(Continued)

FOREIGN PATENT DOCUMENTS

WO   2014/144028 A1   9/2014

OTHER PUBLICATIONS

Huo, L et al. "Single junction organic solar cells based on a novel wide-bandgap polymer with efficiency of 9.7%"; Advanced Materials, vol. 27, No. 18; Publication (online) Apr. 2, 2015; [retrieved from Internet Feb. 28, 2017). (Year: 2015).*
(Continued)

*Primary Examiner* — Joseph P Martinez
(74) *Attorney, Agent, or Firm* — J. Clinton Wimbish; Nexsen Pruet, PLLC

(57) ABSTRACT

In one aspect, single-junction organic photovoltaic devices are provided exhibiting high $V_{oc}$ values while employing single-junction architecture. A single-junction photovoltaic device described herein comprises an anode, a cathode and an active layer residing between the anode and cathode, the active layer comprising an organic electron donor and an organic electron acceptor, wherein the photovoltaic device generates a $V_{oc}$ of at least 1.4 V. Uniquely, high $V_{oc}$
(Continued)

photovoltaic devices described herein can be transparent to the majority of visible and/or infrared spectral irradiation in some embodiments.

29 Claims, 19 Drawing Sheets

(51) Int. Cl.
C09K 9/02 (2006.01)
H01L 51/00 (2006.01)
C09K 9/00 (2006.01)
G02F 1/153 (2006.01)
H01L 51/44 (2006.01)
G02F 1/1516 (2019.01)

(52) U.S. Cl.
CPC ........ *H01L 51/0056* (2013.01); *H01L 51/442* (2013.01); *C09K 2211/1491* (2013.01); *G02F 1/15165* (2019.01); *G02F 2001/1502* (2013.01); *H01L 51/0035* (2013.01); *H01L 51/0037* (2013.01); *H01L 51/0071* (2013.01); *H01L 51/0072* (2013.01); *H01L 51/0073* (2013.01); *H01L 51/0074* (2013.01)

(56) References Cited

U.S. PATENT DOCUMENTS

| | | | |
|---|---|---|---|
| 2011/0061708 A1* | 3/2011 | Huang | G02F 1/15 136/244 |
| 2012/0216854 A1* | 8/2012 | Chidsey | C25B 1/003 136/248 |
| 2014/0084266 A1* | 3/2014 | Yang | H01L 51/442 257/40 |
| 2014/0198371 A1* | 7/2014 | Conklin | G02F 1/163 359/275 |
| 2015/0280025 A1* | 10/2015 | Bellanger | H01L 31/022433 136/256 |
| 2016/0020413 A1* | 1/2016 | Tamayo | H01L 51/0071 136/263 |

OTHER PUBLICATIONS

Huo, L. et al., "Single-Junction Organic Solar Cells Based on a Novel Wide-Bandgap Polymer with Efficiency of 9.7%"; Advanced Materials, vol. 27, No. 18; Publication [online] Apr. 2, 2015 [retrieved Feb. 28, 2017] Retrieved from the Internet : <URL: http://onlinelibrary.wiley.com/doi/10.1002/adma.201500647/full> pp. 2938-2944.

International Search Report and Written Opinion, issued in corresponding International Application No. PCT/US2016/067576, dated Apr. 3, 2017.

* cited by examiner cHBC

SING-JUNCTION ORGANIC PHOTOVOLTAIC DEVICES HAVING HIGH OPEN-CIRCUIT VOLTAGES AND APPLICATIONS THEREOF

RELATED APPLICATION DATA

This application is a U.S. National Phase of PCT/US2016/067576, filed Dec. 19, 2016, which claims priority under 35 U.S.C. § 119(e) to U.S. Provisional Patent Application Ser. No. 62/269,609 filed Dec. 18, 2015, each of which are incorporated herein by reference in their entireties.

STATEMENT OF GOVERNMENT RIGHTS

This invention was made with government support under Grant No. N00014-11-1-0328 awarded by the U.S. Office of Naval Research. The government has certain rights in the invention.

FIELD

The present invention relates to photovoltaic apparatus and, in particular, to single-junction organic photovoltaic apparatus exhibiting high open circuit voltages ($V_{oc}$).

BACKGROUND

Optoelectronic devices using organic materials are increasingly desirable in a variety of applications for a number of reasons. Materials used to construct organic optoelectronic devices are relatively inexpensive in comparison to their inorganic counterparts, thereby providing cost advantages over optoelectronic devices produced with inorganic materials. Moreover, organic materials provide desirable physical properties, such as flexibility, permitting their use in applications unsuitable for rigid materials. Examples of organic optoelectronic devices comprise organic photovoltaic cells, organic light emitting devices (OLEDs), and organic photodetectors.

Photovoltaic devices convert electromagnetic radiation into electricity by producing a photo-generated current when connected across a load and exposed to light. When irradiated under an infinite load, a photovoltaic device produces its maximum possible voltage, the open circuit voltage or $V_{oc}$. When irradiated with its electrical contacts shorted, a photovoltaic device produces its maximum current, I short circuit or $I_{sc}$. Under operating conditions, a photovoltaic device is connected to a finite load, and the electrical power output is equal to the product of the current and voltage. The maximum power generated by a photovoltaic device cannot exceed the product of $V_{oc}$ and $I_{sc}$. When the load value is optimized for maximum power generation, the current and voltage have the values $I_{max}$ and $V_{max}$ respectively.

A systemic disadvantage with present organic photovoltaic apparatus is the inability to generate high photovoltages. This inability can limit or preclude use of organic photovoltaic devices in high voltage applications, such as electrochromic or electrochemical applications. To address this deficiency, tandem or multiple-junction organic photovoltaic devices have been developed. While exhibiting enhanced performance, multiple-junction devices are difficult and time consuming to fabricate. Such fabrication inefficiencies can render multiple-junction organic devices cost prohibitive compared to competing inorganic photovoltaic technologies.

SUMMARY

In one aspect, organic photovoltaic devices are described herein exhibiting high $V_{oc}$ values while employing a single-junction architecture. The high $V_{oc}$ values can advantageously expand device field of use, while the single-junction architecture facilitates efficient and reproducible manufacture. Briefly, a single-junction photovoltaic device described herein comprises an anode, a cathode and an active layer residing between the anode and cathode, the active layer comprising an organic electron donor and an organic electron acceptor, wherein the photovoltaic device generates a $V_{oc}$ of at least 1.4 V. In some embodiments, the difference between the highest occupied molecular orbital (HOMO) of the organic electron donor and lowest unoccupied molecular orbital (LUMO) of the organic electron acceptor is 1.7 eV to 4 eV. Moreover, in some embodiments, the active layer can exhibit an absorption profile desirable for applications requiring high transmittance of visible light and/or infrared light. For example, average transmittance of the active layer in the visible and/or infrared light region(s) can range from 60 percent to 100 percent, in some embodiments.

Single-junction organic photovoltaic devices described herein can find use in a variety of applications, such as electrochromic devices. In some embodiments, an electrochromic device comprises an electrochromic assembly and a single-junction photovoltaic device in electrical communication with the electrochromic assembly for switching the electrochromic assembly between light and dark states via application of a photovoltage. The single-junction photovoltaic device comprises an anode, a cathode and an active layer residing between the anode and cathode, the active layer comprising an organic electron donor and an organic electron acceptor, wherein the photovoltaic device generates a $V_{oc}$ of at least 1.4 V. As described further herein, the single-junction photovoltaic device can be vertically integrated with the electrochromic assembly. In some embodiments, the single-junction photovoltaic device can be vertically integrated with the electrochromic assembly over the same areal footprint. Alternatively, the photovoltaic device is spatially separate from the electrochromic assembly.

Single-junction photovoltaic devices described herein can also find application in UV filtering and/or harvesting. In some embodiments, the UV-absorbing single-junction photovoltaic device described here replaces the existing UV protector coatings of silicon and/or other photovoltaic technologies. By absorbing most of the UV portion of the solar irradiation, the single-junction photovoltaic device described here acts as the UV protector for the silicon and/or other photovoltaic technologies, including organic active layer photovoltaics sensitive to UV degradation, while transmitting the visible and infrared light for power generation by the silicon and/or other photovoltaic devices. The vertically-integrated UV-absorbing single-junction solar cell described here can also be connected with the silicon and/or other photovoltaic devices externally in order to harvest the otherwise unused UV light for power generation.

Single-junction photovoltaic devices described herein can also find application in energy storage architectures. In some embodiments, a battery architecture comprises an electrochemical assembly and a single-junction photovoltaic device in electrical communication with the electrochemical assembly. The single-junction photovoltaic device comprises an anode, a cathode and an active layer residing between the anode and cathode, the active layer comprising an organic electron donor and an organic electron acceptor, wherein the photovoltaic device generates a $V_{oc}$ of at least 1.4 V. As described further herein, the single-junction photovoltaic device can be vertically integrated with the electrochemical assembly. In some embodiments, the single-junction photovoltaic device can be vertically integrated with the electrochemical assembly over the same areal footprint. In other embodiments, the single-junction photovoltaic device is spatially separate or discrete from the electrochemical assembly.

In a further aspect, high $V_{oc}$ values can render single-junction photovoltaic devices described herein suitable for solar fuels applications, such as water splitting. In some embodiments, for example, a water splitting device comprises oxygen ($O_2$) evolving catalyst (OEC), hydrogen ($H_2$) evolving catalyst (HEC) and a single-junction photovoltaic device, the photovoltaic device comprising an anode, a cathode and active layer residing between the anode and cathode. The active layer comprises an organic electron donor and an organic electron acceptor, wherein the single-junction photovoltaic device generates a $V_{oc}$ of at least 1.4 V. In some embodiments, the water splitting device is wireless wherein the OEC and HEC are integrated with the single-junction photovoltaic device. The OEC, for example, can be deposited on the photovoltaic device anode while the HEC is deposited on the cathode. In some embodiments, the anode and cathode of the photovoltaic device can be fabricated from OEC and HEC catalytic materials, respectively. Alternatively, the water splitting device can be wired wherein the OEC and/or HEC are not integrated into to the photovoltaic device.

These and other embodiments are further described in the following detailed description.

DETAILED DESCRIPTION

Figure 1A:
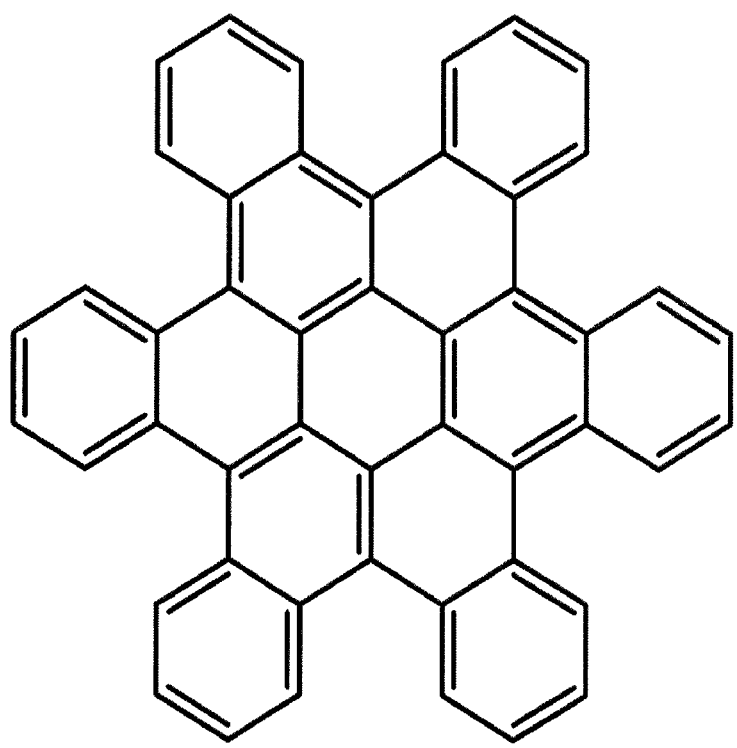
FIGS. 1A-IC illustrate cHBC and various substituted cHBCs from which electron donor and electron acceptor of the active layer can be selected according to some embodiments.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

I. Single-Junction Photovoltaic Devices

In one aspect, single-junction organic photovoltaic devices are provided exhibiting high $V_{oc}$ values while employing single-junction architecture. A single-junction photovoltaic device described herein comprises an anode, a cathode and an active layer residing between the anode and cathode, the active layer comprising an organic electron donor and an organic electron acceptor, wherein the photovoltaic device generates a $V_{oc}$ of at least 1.4 V. In some embodiments, the photovoltaic device generates a $V_{oc}$ having a value selected from Table I.

TABLE I

| Photovoltaic Device $V_{oc}$ |
| --- |
| ≥1.5 V |
| ≥1.6 V |
| ≥2 V |
| ≥2.5 V |
| 1.4 V to 4 V |
| 1.6 V to 4 V |
| 1.8 V to 4 V |
| 2 V to 4 V |
| 1.4 V to 3.7 V |
| 1.5 V to 3.5 V |

Turning to specific components, the active layer of the photovoltaic device comprises an organic electron donor and an organic electron acceptor. Any species of organic electron donor and organic electron acceptor having electronic structure consistent with photovoltaic device performance metrics described herein can be employed in the active layer. Performance metrics include, but are not limited to, $V_{oc}$ and absorption and/or transmittance profile(s) in one or more regions of the electromagnetic spectrum. In some embodiments, the difference between the HOMO of the organic electron donor and LUMO of the organic electron acceptor is 1.7 eV to 4 eV. The HOMO/LUMO difference or offset between organic electron donor and acceptor of the active layer can also be selected from Table II.

TABLE II

| HOMO/LUMO Offset of Organic Electron Donor/Acceptor |
| --- |
| 1.9 eV to 4 eV |
| 2 eV to 4 eV |
| 2.2 eV to 4 eV |
| 2.5 eV to 4 eV |
| 2.8 eV to 4 eV |
| 3 eV to 4 eV |

Organic electron donor and organic electron acceptor of the active layer can exhibit any electromagnetic radiation absorption profile not inconsistent with the objectives of the present invention. In some embodiments, organic electron donor and acceptor exhibit peak absorbance in the range of 250 nm to 450 nm. In such embodiments, the active layer is largely transparent to light in the visible and near infra-red regions. For example, the active layer can generally display an average transmittance in the visible light region of 60 percent to 100 percent. Average visible light transmittance of an active layer described herein can also have a value selected from Table III.

TABLE III

| Average Visible Light and/or Infrared Transmittance of Active Layer (%) |
| --- |
| 70-100 |
| 75-100 |
| 80-100 |
| 70-98 |
| 80-98 |
| 80-95 |
| 85-98 |

As discussed further herein, active layers having the foregoing transmittance values render the photovoltaic devices particularly suited for applications where transparency in the visible light region and/or infrared light region is a key requirement, such as windows for commercial and industrial buildings, homes and transportation vehicles including cars, buses, trucks, trains and airplanes.

In some embodiments where transmittance in the visible light region is not of high importance, the organic electron donor and organic electron acceptor exhibit absorbance from 300 nm to 620 nm. This absorption profile captures peak intensity of the visible light region and can enhance photovoltaic device performance for battery and/or water splitting applications requiring or benefiting from high-voltage power. In some embodiments, electron donor and electron acceptor of the active layer exhibit any one of the absorption/transmittance profiles described herein in conjunction with a HOMO/LUMO offset of 1.7 eV to 4 eV or an offset selected from Table II.

Figure 1B:
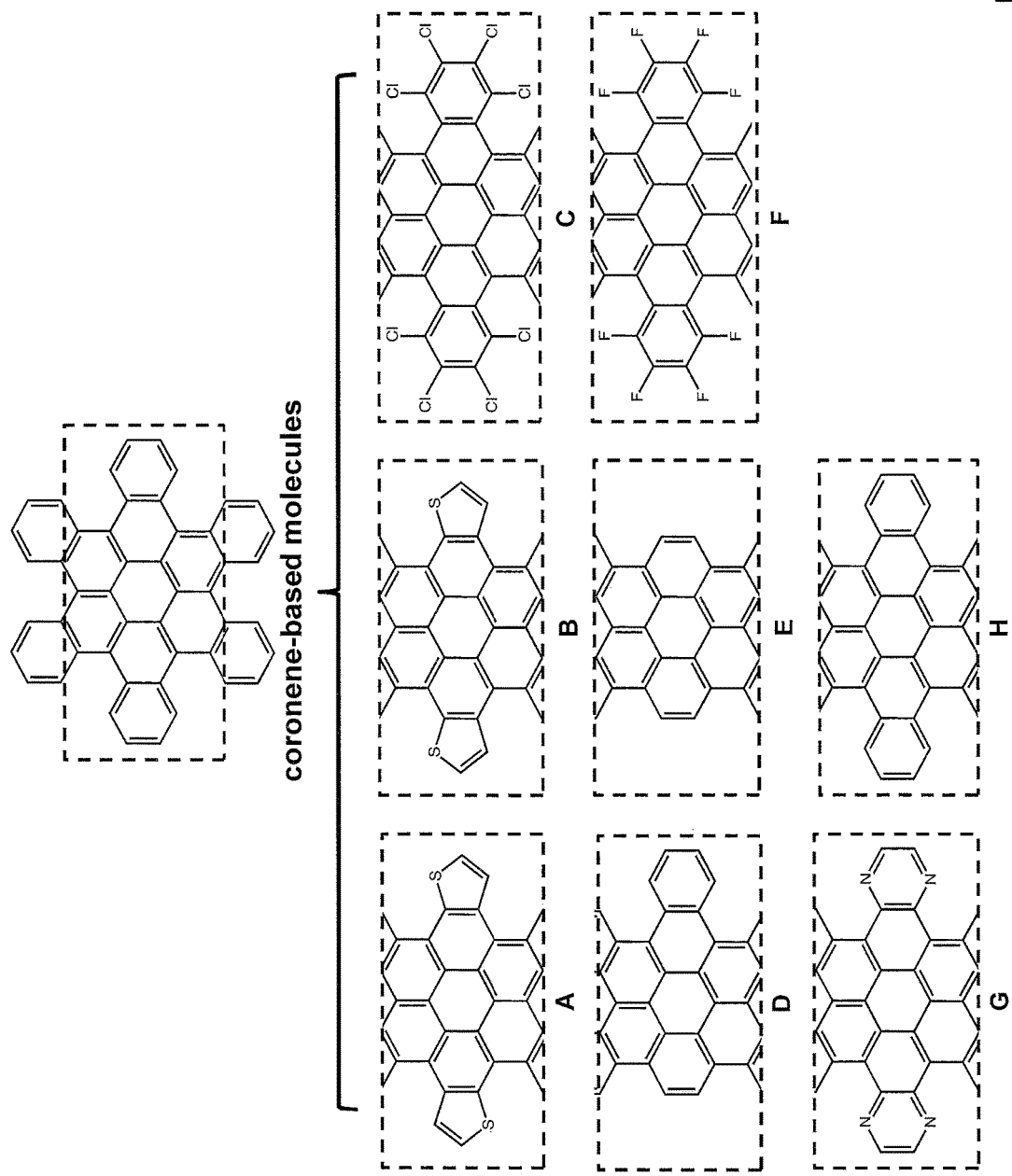
Figure 1C:
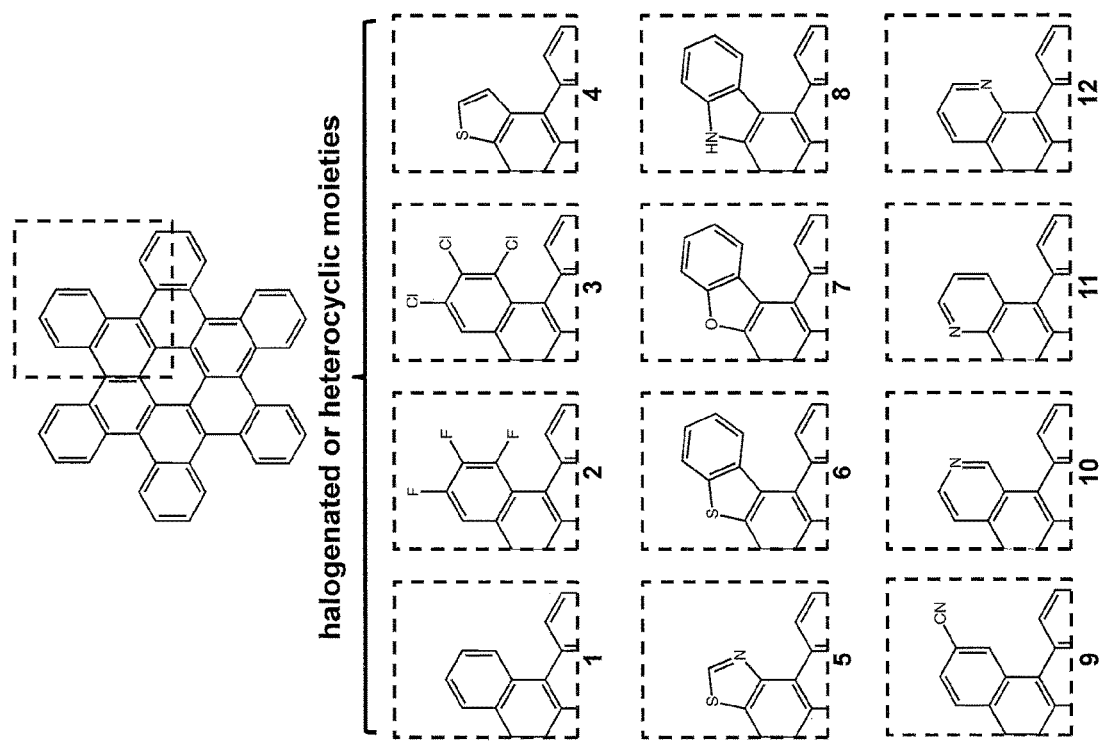

In some embodiments, organic electron donor and organic electron acceptor of the active layer are selected from polyaromatic compounds satisfying the foregoing HOMO/LUMO offset and/or transmittance requirements. Suitable polyaromatic compounds can comprise substituted coronenes. A coronene core, for example, can be annulated with peripheral aromatic substituents including, but not limited to, halogenated phenyl groups and/or extended heteroaromatic groups such as benzofuran, benzothiophene, pyridine and/or similar aromatic substituents. In some embodiments, organic electron donor and organic electron acceptor are selected from contorted hexabenzocoronene (cHBC) and substituted cHBCs. FIGS. 1A-IC illustrate cHBC and various substituted cHBCs from which electron donor and electron acceptor of the active layer can be selected, according to some embodiments. Non-limiting embodiments A-H of FIG. 1B illustrate various substitutions or deletions on the coronene core. Similarly, non-limiting embodiments 1-12 of FIG. 1C illustrate various halogenated or heterocyclic substituents on the coronene core. In contrast to many prior organic active layer constructions, the organic electron acceptor, in some embodiments, is not a fullerene, such as fullerene-$C_{60}$ or fullerene-$C_{70}$ or a fullerene derivative.

In addition to various organic electron donor and acceptor species, the active layer can have any architecture not inconsistent with the objectives of the present invention. In some embodiments, a planar heterojunction is formed between adjacent layers of organic electron donor and organic electron acceptor. In such embodiments, thickness of the organic electron donor layer and organic electron acceptor layer can be selected according to several considerations including sufficient light absorption by the active layer and exciton diffusion path lengths. Organic electron donor and acceptor layers can generally have individual thicknesses of 1 to 450 nm. In some embodiments, individual thicknesses of organic electron donor and acceptor layers can be 1 nm to 400 nm.

In some embodiments, the active layer exhibits a gradient heterojunction architecture. In such an architecture, organic electron donor gradually decreases from 100 percent at the anode side to zero percent at the cathode side of the active layer. Similarly, organic electron acceptor gradually decreases from 100 percent from the cathode side to zero percent at the anode side of the active layer. In other embodiments, the active layer can exhibit a mixed heterojunction architecture wherein organic electron donor and acceptor are mixed or dispersed throughout one another. In some embodiments, organic electron donor and organic electron acceptor are mixed in solution and deposited to form the active layer. The active layer is subsequently annealed to induce spinodal decomposition or phase separation of the active layer, thereby forming mixed heterojunction architectures. In some embodiments, the organic donor and organic electron acceptor are co-deposited from separate solutions or from the gas-phase to form a mixed active layer. In further embodiments, the active layer can have any combination of planar heterojunction, gradient heterojunction and/or mixed heterojunction architectures. Additionally, the active layer can be pinhole-free, improving device areal scalability and fabrication yield.

In addition to the active layer, photovoltaic devices described herein can comprise one or more charge transport layers and/or exciton blocking layers. A hole transport layer (HTL) or exciton blocking layer, in some embodiments, is positioned between the anode and active layer. For example, an HTL can comprise one or more organic or inorganic layers such as poly(3,4-ethylenedioxythiophene):poly(styrenesulfonate) PEDOT:PSS, polyaniline-poly(2-acrylamido-2-methyl-1-propane-sulfonic acid) PANI-PAAMPSA and/or transition metal oxide. Suitable transition metal oxide can comprise molybdenum oxide, $MoO_x$, where x denotes any ratio of Mo to O. Additional transition metal oxides include vanadium oxide, nickel oxide or oxides of similar electronic structure.

An electron transport layer (ETL) or exciton blocking layer, in some embodiments, is positioned between the cathode and the active layer. An ETL can comprise one or more organic or inorganic layers such as bathocuproine (BCP), calcium fluoride, lithium fluoride, poly[(9,9-bis(3-(N,N-dimethylamino)propyl)-2,7-fluorene)-alt-2,7-(9,9-di-octylfluorene)] PFN and/or transition metal oxide. Suitable transition metal oxide for an ETL can comprise titanium oxide ($TiO_x$) and/or zinc oxide. HTL and/or ETL layers can be deposited by any method not inconsistent with the objectives of the present invention. HTL and/or ETL layers can be deposited by sputtering or thermal evaporation. In other embodiments, HTL and/or ETL layers can be deposited by solution-based techniques such as spin coating, blade coating, knife coating, slot-die coating, screen printing, flexographic printing, Gravure printing, ink jet printing or spray coating. In further embodiments, HTL and/or ETL layers may be deposited by lamination.

The anode and/or cathode of a photovoltaic device described herein, in some embodiments, is formed of a radiation transmissive material. In being radiation transmissive, the anode and/or cathode is transparent or substantially transparent for portions of the electromagnetic spectrum characteristic of solar spectral irradiation. In some embodiments, the anode and/or cathode are formed of a radiation transmissive metal oxide. Suitable radiation transmissive metal oxides can include tin oxide (ITO), gallium indium tin oxide (GITO), zinc indium tin oxide (ZITO), indium zinc oxide (IZO) and silver zinc oxide (AZO) and chemically-functionalized versions of metal oxides such as fluorine-doped tin oxide (FTO). In other embodiments, radiation transmissive materials for the anode and/or cathode can include organic materials such conductive or semiconductive polymeric species. Suitable polymeric species can comprise polyaniline (PANI) and its chemical relatives, such as PANI-PAAMPSA. In some embodiments, 3,4-polyethylenedioxythiophene (PEDOT) can be a suitable radiation transmissive polymeric material for the anode and/or cathode. Nanowire constructions can also be used as radiation transmissive material for the anode and/or cathode. In some embodiments, for example, a radiation transmissive anode and/or cathode can be a metal-nanowire mesh, such as silver nanowires dispersed in polymeric matrix. Metal films of sufficient thinness to transmit significant near-ultraviolet, visible and/or infrared radiation may also be employed as anode and/or cathode. In some embodiments, the anode and/or cathode exhibit average transmittance in the visible light region of 80 percent to 100 percent. In other embodiments, the anode or cathode may be opaque. The anode or cathode for example, may be formed of metal, such as aluminum, silver or copper of sufficient thickness to reflect light or otherwise block light transmission. Moreover, thin-film layers of molybdenum oxide or LiF can be employed adjacent to, or mixed with, transmissive or opaque anode and/or cathode architectures to improve photovoltaic device performance or device transparency in the visible and/or infrared region(s).

Figure 2:
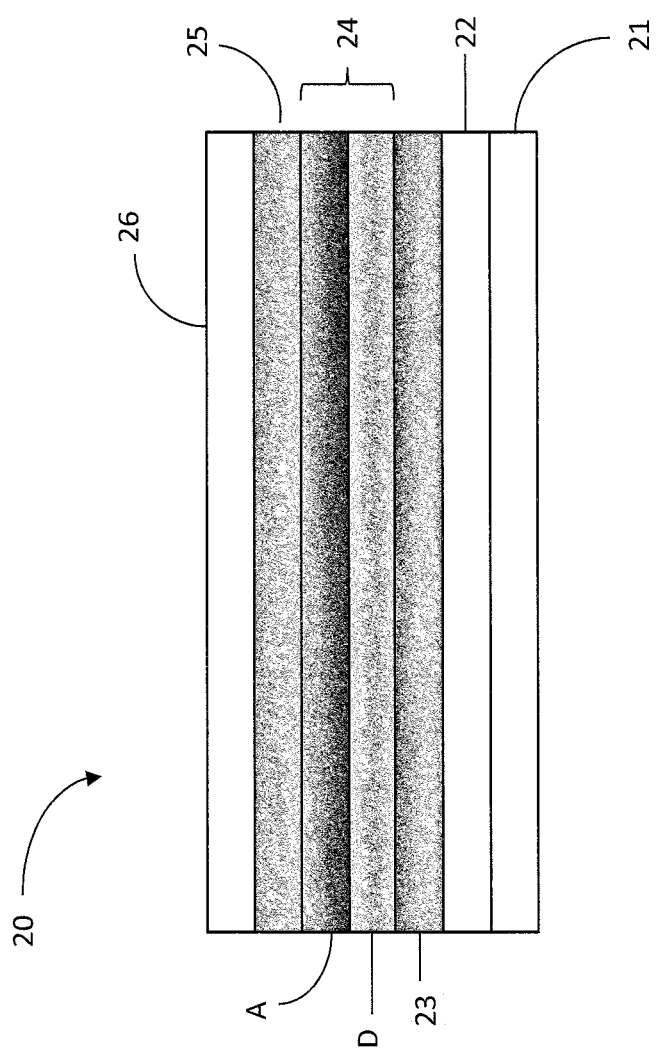
FIG. 2 illustrates a single-junction photovoltaic device according to some embodiments.

FIG. 2 illustrates a single-junction photovoltaic device according to some embodiments described herein. As illustrated in FIG. 2, the photovoltaic device 20 comprises a glass or polymeric substrate 21 transparent to near-UV, visible and infrared radiation. A radiation transmissive anode 22 is deposited on the substrate 21 followed by an HTL 23. The active layer 24 resides over the HTL 23. In the embodiment of FIG. 2, the active layer 24 comprises a planar heterojunction formed by an organic electron donor (D) and an organic electron acceptor (A). As described herein, the organic electron donor (D) and organic electron acceptor (A) can have a HOMO/LUMO offset of at least 1.7 eV or at least 2 eV. In alternative embodiments, the active layer 24 may exhibit a gradient or mixed heterojunction architecture. An ETL 25 is positioned between the cathode 26 and active layer 24.

II. Electrochromic Devices

Due to high $V_{oc}$ values, single-junction organic photovoltaic devices described herein can find use in electrochromic devices. In addition to modulating the transmission of visible light into buildings and transportation vehicles in order to augment lighting/shading needs and/or to provide privacy, solar-powered electrochromic devices described herein can also modulate the transmission of infrared light into buildings and transportation vehicles in order to augment heating/cooling needs. $V_{oc}$ values provided by the single junction photovoltaic devices are sufficient to drive a variety of redox chemistries employed in electrochromic assemblies. In some embodiments, an electrochromic device comprises an electrochromic assembly and a single-junction photovoltaic device in electrical communication with the electrochromic assembly for switching the electrochromic assembly between light and dark states via application of a photovoltage. The single-junction photovoltaic device comprises an anode, a cathode and an active layer residing between the anode and cathode, the active layer comprising an organic electron donor and an organic electron acceptor, wherein the photovoltaic device generates a $V_{oc}$ of at least 1.4 V. Single-junction photovoltaic devices employed in electrochromic devices described herein can have any architecture, properties and/or performance metrics set forth in Section I above.

Moreover, the electrochromic assembly comprises a single electrochromic layer. In some embodiments, the electrochromic assembly comprises a plurality of electrochromic layers. The one or more electrochromic layers of the assembly can exhibit redox properties switchable between light/clear and dark/opaque states by photovoltages provided by photovoltaic devices described herein.

In some embodiments, for example, an electrochromic assembly comprises a single electrochromic polymeric (ECP) material. The ECP can exhibit a color change when oxidized or reduced. For example, the ECP can be in a bleached or clear state when oxidized and a colored state when reduced. Alternatively, the ECP can exhibit a bleached or clear state when reduced and a colored state when oxidized. When a single ECP layer is employed, the electrochromic assembly can further comprise a charge balance layer that is bleached or clear in both oxidized and reduced states. An electrolyte is positioned between the charge balance layer and ECP.

In some embodiments, the electrochromic assembly comprises two ECP materials separated by an electrolyte. In such embodiments, the ECP materials are complementary in that the first ECP material is bleached or clear in the oxidized state while the second ECP material is bleached or clear in the reduced state. When subsequently reduced, the first ECP material becomes colored, and when subsequently oxidized, the second ECP also becomes colored. In one embodiment, for example, the electrochromic assembly can comprise electrochromic layers of PEDOT:PSS and PANI-PAAMPSA separated by electrolyte. PEDOT:PSS and PANI-PAAMPSA are clear when the former is oxidized and the latter is reduced. Similarly, both polymers are dark or colored when PEDOT:PSS is reduced and PANI-PAAMPSA is oxidized.

The electrochromic assembly, in some embodiments, employs one or more electrochromic layers that effectuate color change via ion intercalation. For example, the electrochromic assembly can comprise one or more metal oxide layers, such as tungsten oxide ($WO_3$) and/or molybdenum oxide ($MoO_3$). Mixed transition metal oxides such as vanadia-ceria mixed oxides can also be employed as electrochromic layers in the assembly. Intercalated ionic species can generally include $H^+$ as well as alkali metal ions of $Li^+$, $Na^+$ and $K^+$. Metal oxides exhibiting little to no color change, such as ceria, can be employed as charge balance layers in the electrochromic assembly.

The electrochromic assembly, in some embodiments, employs one or more electrochromic layers that scatter or transmit light via reassembly of liquid crystals. For example, the electrochromic assembly can comprise one or more polymer-dispersed liquid crystal layers, such as, liquid crystal E7 dispersed in photocurable polymer NOA65 (Norland Products). In such embodiments, the electrochromic layer scatter light in off state when the liquid crystals are randomly oriented in the polymer matrix, and transmit light in the on state due to preferential orientation of the liquid crystals with applied voltage.

The electrochromic assembly, in some embodiments, employs one or more electrochromic layers that independently absorb or transmit visible and infrared light. Such embodiments can comprise separate visible and infrared light modulating materials, such as ITO nanocrystals embedded in niobium oxide ($NbO_x$) glass matrix. Such embodiments can also comprise ECP layers that absorb and transmit visible and/or infrared light in their different oxidation states, such as PANI-PAAMPSA.

Figure 3:
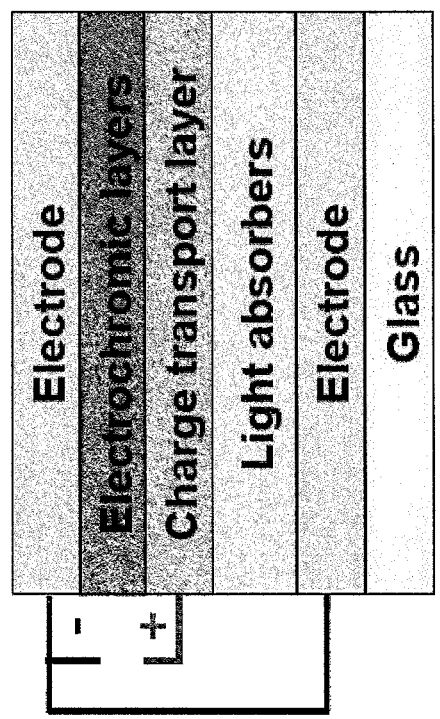
FIG. 3 illustrates vertical integration of a single-junction photovoltaic device with an electrochromic assembly according to some embodiments.

In some embodiments, the single-junction photovoltaic device can be transparent in the visible and/or infrared and thus be vertically integrated with the electrochromic assembly. In some embodiments, the single-junction photovoltaic device is vertically integrated over the same areal footprint as the electrochromic assembly. FIG. 3 illustrates vertical integration of a single-junction photovoltaic device with an electrochromic assembly according to some embodiments described herein. Vertical integration of the single-junction photovoltaic device with the electrochromic assembly can greatly simplify application of electrochromic devices to a variety of products including windows for commercial and industrial buildings, homes and transportation vehicles including cars, buses, trucks, trains and airplanes. Electrochromic devices, for example, can be positioned between window panes for environmental isolation. Vertical integration of the photovoltaic apparatus can render the electrochromic device standalone, thereby greatly simplifying electrical wiring that complicates prior electrochromic apparatus installation.

Figure 4:
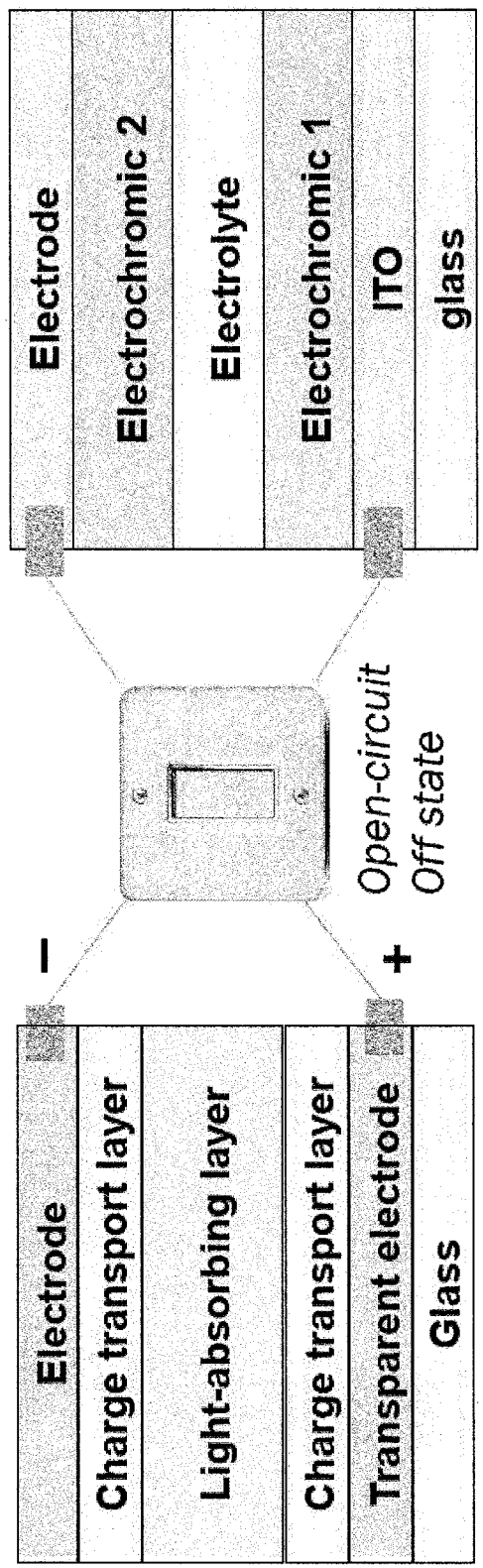
FIG. 4 illustrates an electrochromic device in the open-circuit, off-state according to some embodiments.
Figure 5:
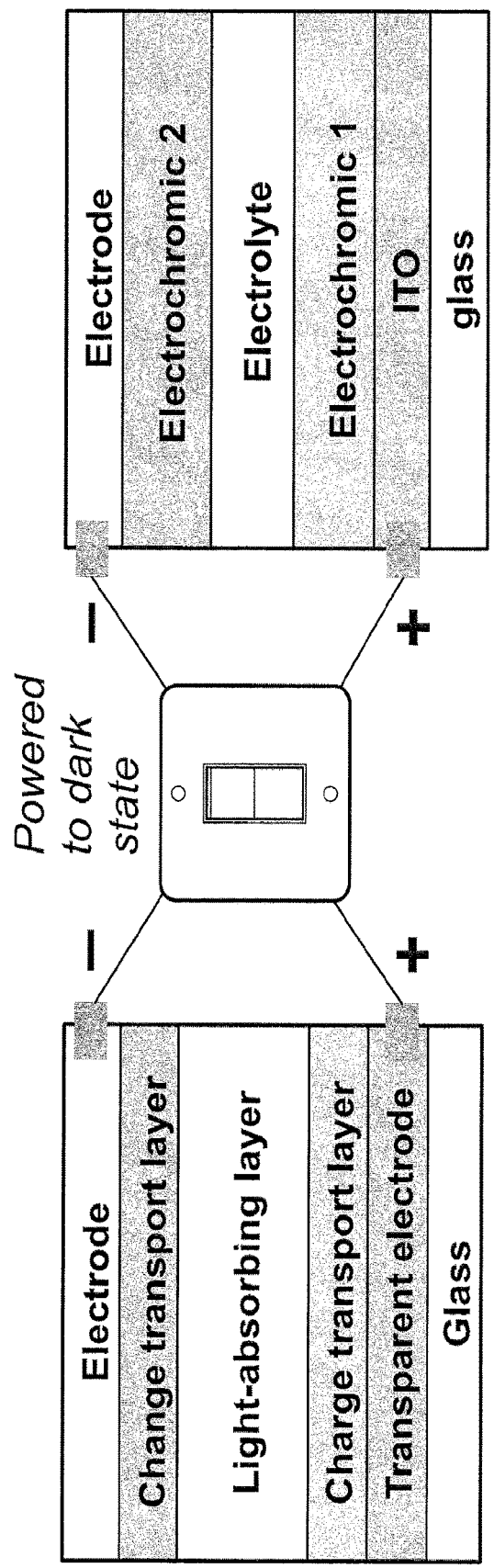
FIG. 5 illustrates the electrochromic device of FIG. 4 in the powered to dark state.
Figure 6:
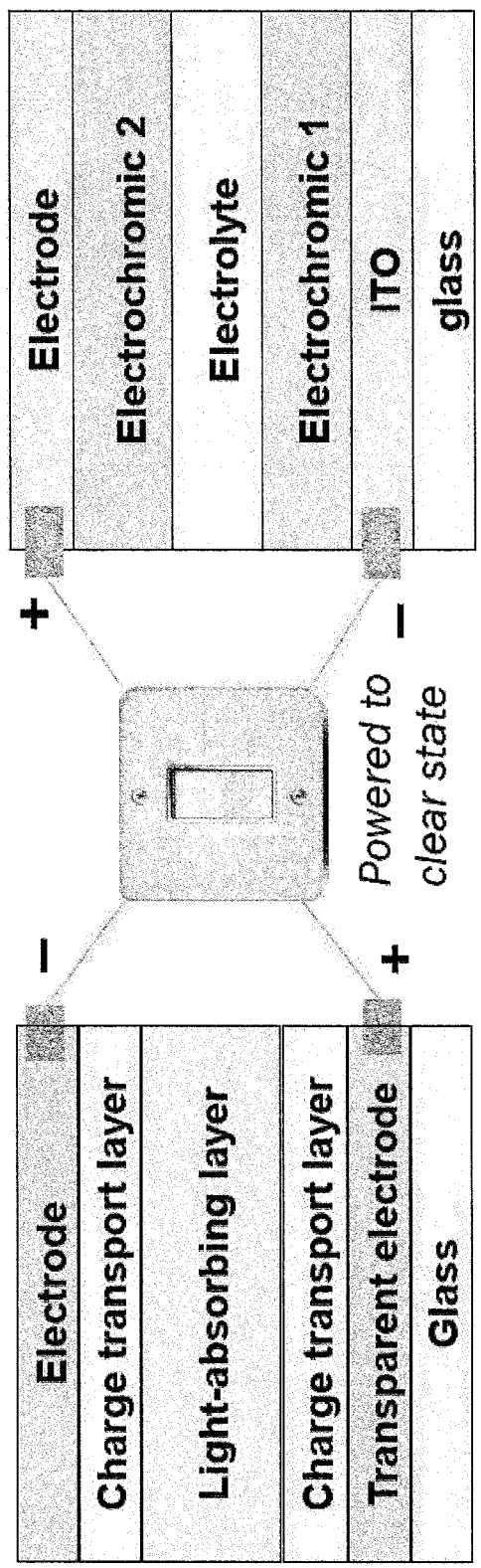
FIG. 6 illustrates the electrochromic device of FIG. 5 powered to the clear or bleached state.

Alternatively, a single-junction photovoltaic device described herein is spatially separate or external to the electrochromic assembly. FIGS. 4-6 illustrate an electrochromic device comprising a single-junction organic photovoltaic device having architecture described herein in electrical communication with an electrochromic assembly via a circuit or energy storage component according to some embodiments. FIG. 4 illustrates the electrochromic device in the open-circuit, off-state while FIG. 5 illustrates the electrochromic device in the powered to dark state. FIG. 6 illustrates the electrochromic device powered to the clear or bleached state.

III. Energy Storage Architectures

Single-junction photovoltaic devices described herein can also find application in energy storage architectures including, but not limited to, batteries and capacitors. In some embodiments, a battery architecture comprises an electrochemical assembly and a single-junction photovoltaic device in electrical communication with the electrochemical assembly.

Figure 7:
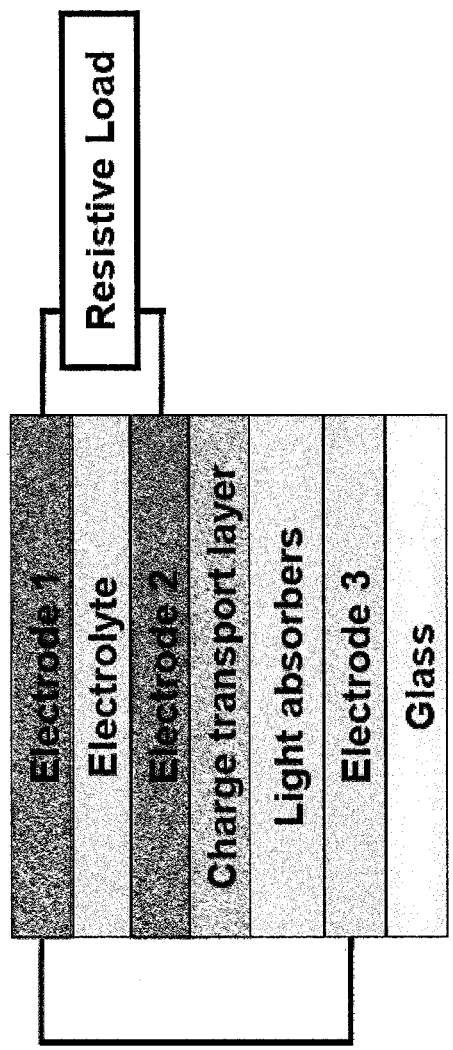
FIG. 7 illustrates a battery architecture vertically integrating a single-junction photovoltaic device described herein according to some embodiments.

The single-junction photovoltaic device comprises an anode, a cathode and an active layer residing between the anode and cathode, the active layer comprising an organic electron donor and an organic electron acceptor, wherein the photovoltaic device generates a $V_{oc}$ of at least 1.4 V. As described further herein, the single-junction photovoltaic device can be vertically integrated with the electrochemical assembly. In other embodiments, the single-junction photovoltaic device is spatially separate or external from the electrochemical assembly. Single-junction photovoltaic devices employed in battery designs described herein can have any architecture, properties and/or performance metrics set forth in Section I above. FIG. 7 illustrates a battery architecture vertically integrating a single-junction photovoltaic device described herein. Depending on the embodiment, additional circuitry can be included between electrodes 1 and 3 and 1 and 2.

In some embodiments, single-junction photovoltaic devices described herein can be used to power or assist in powering various optoelectronic devices, such as Google Glass. Given the high degree of visible and/or infrared light transmittance, single-junction photovoltaic devices described herein can also be integrated into display screens of electronic devices including tablets, phones and computers. A single-junction photovoltaic device, in some embodiments, can have an areal footprint commensurate with the area of the display screen. In other embodiments, a single-junction photovoltaic device can have an areal footprint that is a portion of the area of the display screen. In these embodiments, photocurrent generated by the single-junction photovoltaic device can power or assist in powering the electronic device. The single-junction photovoltaic device, for example, can be part of the electronic device power supply. In one embodiment, the single-junction photovoltaic device can provide battery charging.

IV. Solar Powered Electrochemical Devices

In a further aspect, high $V_{oc}$ values can render single-junction photovoltaic devices described herein suitable for solar fuels applications, such as water splitting. In some embodiments, for example, a water splitting device comprises oxygen ($O_2$) evolving catalyst (OEC), hydrogen ($H_2$) evolving catalyst (HEC) and a single-junction photovoltaic device, the photovoltaic device comprising an anode, a cathode and active layer residing between the anode and cathode. The active layer comprises an organic electron donor and an organic electron acceptor, wherein the single-junction photovoltaic device generates a $V_{oc}$ of at least 1.4 V. Single-junction photovoltaic devices employed in water splitting devices described herein can have any architecture, properties and/or performance metrics set forth in Section I above.

In some embodiments, the water splitting device is wireless wherein the OEC and HEC are integrated with the single-junction photovoltaic device. The OEC, for example, can be deposited on the photovoltaic device anode while the HEC is deposited on the cathode. In some embodiments, the anode and cathode of the photovoltaic device can be fabricated from OEC and HEC materials, respectively. Alternatively, the water splitting device can be wired wherein the OEC and/or HEC are not integrated into to the photovoltaic device. Suitable OEC materials can comprise cobalt catalyst, such as cobalt oxide. Co-OEC can self-assemble upon oxidation to $Co^{2+}$, can self-heal and can operate in buffered electrolyte with pure or natural water at room temperature.

Figures 8A, 8B:
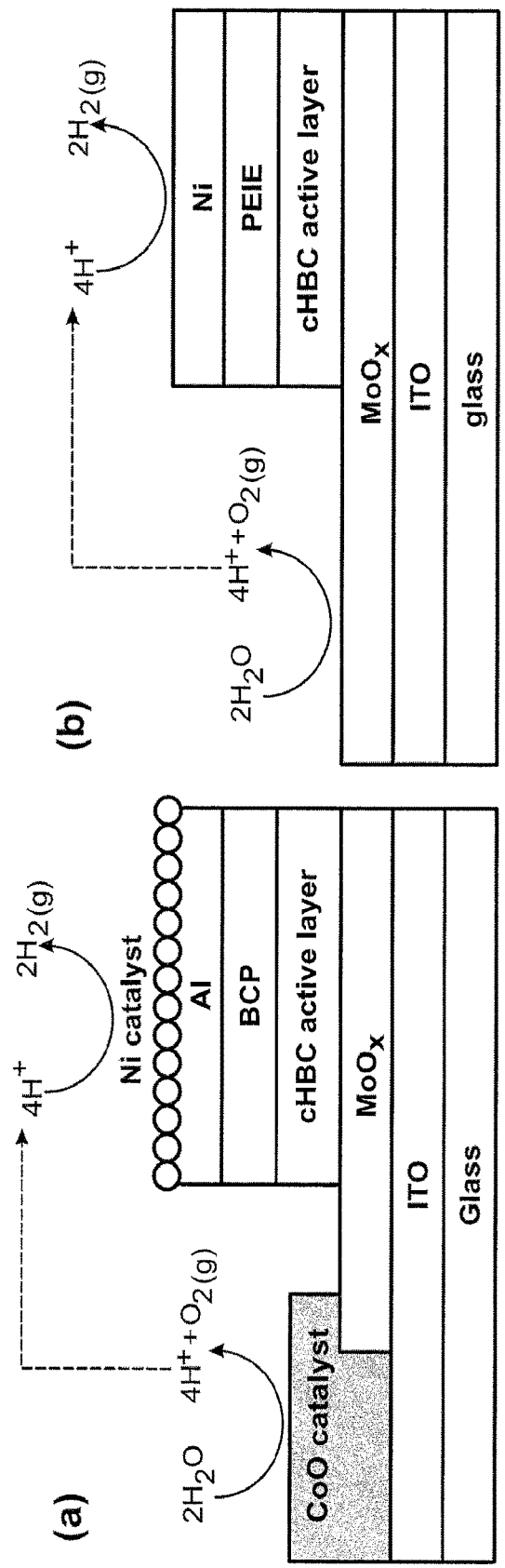
FIGS. 8A and 8B illustrate wireless water splitting devices according to some embodiments.

Cobalt phosphates may also be employed as the OEC. Other metal oxides and/or hydroxides may also serve as the OEC including nickel oxide and hydroxide, $Ni(OH)_2$. Suitable HEC materials can include nickel and nickel alloys, such as NiMo and NiMoZn. In some embodiments, $Ni(OH)_2$ may also serve as a HEC material. Moreover, aqueous electrolyte employed with water splitting devices described herein can have a neutral pH or slightly basic pH. FIGS. 8A and 8B illustrate wireless water splitting devices according to some embodiments.

In some embodiments, individual single-junction organic photovoltaic devices can be stacked upon one another to increase performance for water splitting applications. Photovoltaic device stacking can also be applied to electrochromic devices and battery architectures described herein.

These and other embodiments are further illustrated by the following non-limiting examples.

Example 1

Single-Junction Organic Photovoltaic Devices

Single-junction organic photovoltaic devices having the architecture of FIG. 2 were produced according to the following methods. Active layer composition and architecture for each class of single-junction photovoltaic device is provided in Table IV. A comparative single-junction photovoltaic device was also prepared. Active layer composition and architecture of the comparative device class is also provided in Table IV.

TABLE IV

Single-Junction Organic Photovoltaic Devices

| Photovoltaic Device | Organic Donor (D) | Organic Acceptor (A) | HOMO/LUMO Offset (eV) |
|---|---|---|---|
| 1 (Inventive) | contorted tetrabenzofuranyldibenzocoronene (cTBFDBC) | 8Cl-cHBC (A1) | 2.2 |
| 2 (Inventive) | cTBFDBC | 12Cl-cHBC (A2) | 1.9 |
| 3 Comparative | cTBFDBC | Fullerene ($C_{60}$) | 1.3 |

Figure 9A:
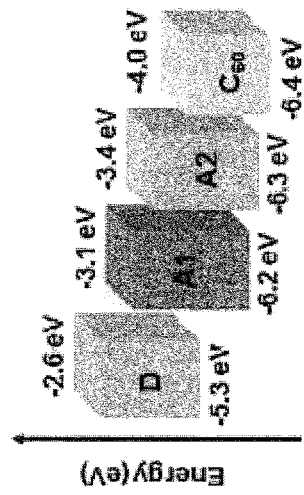
FIG. 9A illustrates the chemical structure of 8Cl-cHBC (A1) and 12Cl-cHBC (A2).
Figure 9B:
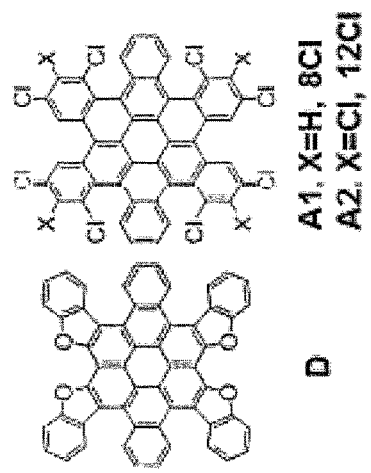
FIG. 9B illustrates HOMO and LUMO energy levels of A1 and A2 as determined by ultraviolet photoelectron (UPS) and inverse photoemission (IPES) spectroscopies, respectively.
Figure 9C:
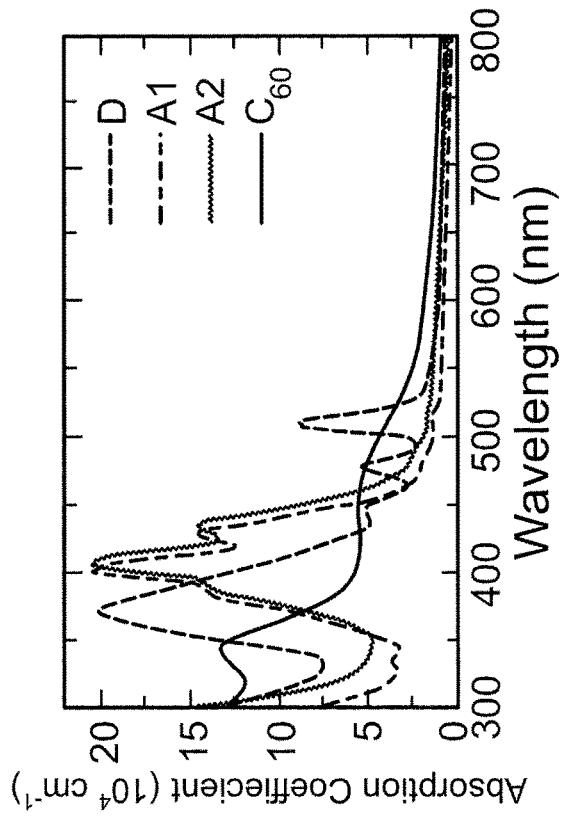
FIG. 9C illustrates the absorption spectra for thin films of organic electron donor and organic electron acceptor species of active layers according to some embodiments.

FIG. 9A illustrates the chemical structure of organic electron acceptors 8Cl-cHBC (A1) and 12Cl-cHBC (A2). FIG. 9B illustrates HOMO and LUMO energy levels of A1 and A2 as determined by ultraviolet photoelectron (UPS) and inverse photoemission (IPES) spectroscopies, respectively. The energy levels of D were reported previously (See, Loo et al., *Chem. Mater.* 28, 673-681 2016) and those of $C_{60}$ were obtained from the literature (See, Benning et al., *Phys. Rev. B.* 45, 6899-6913 1992). FIG. 9C illustrates the absorption spectra for D, A1, A2 and $C_{60}$.

Materials and Methods
Molecular Semiconductors D, A1, A2
D (or cTBFDBC; contorted tetrabenzofuranyldibenzocoronene; dibenzo(3,4:9,10)benzo(4',5')furan(3',2':5,6)-benzo(4',5')furan(2',3':7,8)benzo(4',5)furan-(3',2':11,12) coroneno(1,2-b)benzofuran) was synthesized according methods described by Loo, et al., *Chem. Mat.* 28, 673-681 (2016). A1 (or 8Cl-cHBC; 1,3,6,8,13,15,18,20-octachlorotrinaphtho[1,2,3,4-fgh:1', 2', 3', 4'-pqr: 1", 2", 3", 4"-$za_1b_1$] trinaphthylene) and A2 (or 12Cl-cHBC; 1,3,6,7,8,13,14,15,18,19,20-dodecachlorotrinaptho[1,2,3,4-fgh:1',2',3',4'-pqr: 1",2",3",4"-$za_1b_1$]trinapthylene) were synthesized according to methods described by Loo, et al., *Chem. Mat.* 27, 1892-1900 (2015).

Thin Film Preparation and Characterization $C_{60}$ and D were purified once using horizontal physical-vapor transport with Ar as the inert carrier gas. A1 and A2 were purified via recrystallization in toluene. Thin films of $C_{60}$, D, A1 and A2 were thermally evaporated at a rate of 1 Å/s in a chamber with a pressure $<2\times10^{-6}$ Torr. Absorption spectra of thin films of $C_{60}$, D, A1, and A2 on glass slides were collected on an Agilent Cary 5000 UV-Vis-NIR spectrophotometer. Film thicknesses for FIG. 9C and FIG. 11 were identical to the thicknesses used in devices below: 23 nm (D), 17 nm (A1, A2) and 40 nm ($C_{60}$). Ultraviolet photoelectron spectroscopy (UPS) and inverse photoelectron spectroscopy (IPES) measurements were performed at room temperature, in an ultrahigh vacuum chamber with a base pressure of $<2\times10^{-10}$ Torr. 10-nm thick films of A1 or A2 were evaporated in a thermal evaporator located in a nitrogen-filled glovebox and transported to the measurement vacuum system in nitrogen. UPS was performed using a Specs gas discharge lamp operating with helium, yielding Helium I photons at 21.22 eV. IPES was performed in isochromat mode using a home-built setup (See *Chem. Phys. Lett.* 272, 43-47).

Solar Cell Fabrication and Testing $MoO_3$ and bathocuproine (BCP) were used as-received. Glass substrates (23 mm×27 mm) patterned with an ITO strip 7.5 mm wide and 23 mm long (20 Ω/square) were cleaned by sonication in deionized water, acetone, and isopropyl alcohol and dried with nitrogen. The substrates were then immediately transferred to a nitrogen glovebox for sequential evaporation of device layers. $MoO_3$ and BCP layers were each 5 nm thick, deposited at 1 Å/s. After deposition of BCP, 60 nm of Al was evaporated through patterned masks at a rate of 1-3 Å/s to define the active area. The devices were placed under AM1.5G 100 mW/cm² illumination in a nitrogen-filled glovebox and the current density-voltage (J-V) characteristics were acquired with a Keithley 2400 source measurement unit. External quantum efficiency (EQE) measurements were performed using a 300 W Xenon arc lamp (Newport Oriel) with filtered monochromatic light from a Cornerstone 260¼ M double grating monochromator (Newport 74125). 57, 28, and 24 devices comprising A1, A2, and $C_{60}$ as the acceptor, respectively were fabricated and tested. The active area of each device for these experiments was 0.18 cm². The yield on functional devices was 100% with all three acceptors; the average and standard deviation values for relevant device characteristics are summarized in Table V.

TABLE V

Photovoltaic Device Characteristics

| PV Device | Acceptor | $V_{oc}$ (V) | $J_{sc}$ (mA/cm²) | Power (mW/cm²) | Fill Factor |
|---|---|---|---|---|---|
| 1 | A1 | 1.63 ± 0.01 | 1.4 ± 0.1 | 1.3 ± 0.1 | 0.58 ± 0.01 |
| 2 | A2 | 1.46 ± 0.01 | 1.8 ± 0.1 | 1.5 ± 0.1 | 0.60 ± 0.01 |
| Comp. | $C_{60}$ | 0.82 ± 0.01 | 2.7 ± 0.2 | 1.3 ± 0.1 | 0.61 ± 0.01 |

Figure 10:
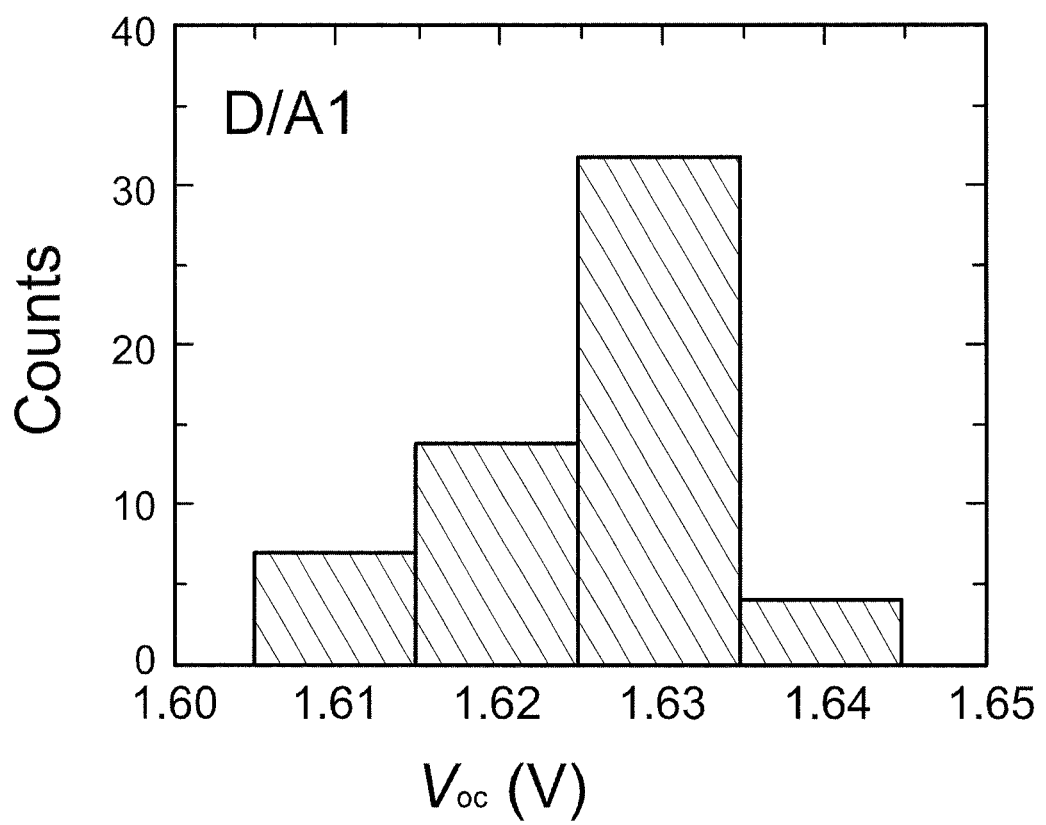
FIG. 10 is a histogram of $V_{oc}$ across photovoltaic device 1 having a D/A1 active layer according to some embodiments.
Figure 11:
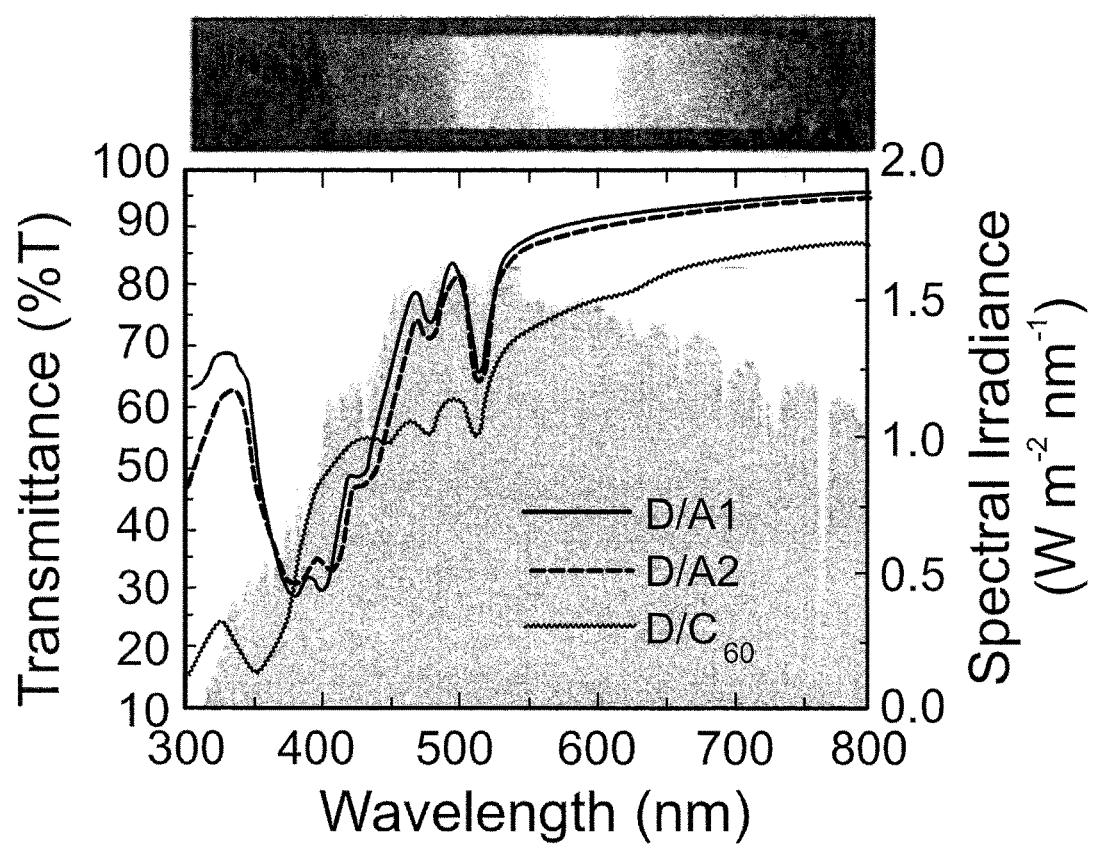
FIG. 11 illustrates percent transmittance of visible and near-infrared light by photovoltaic device active layers according to some embodiments.

As provided in Table V, photovoltaic devices 1 and 2 having composition and architecture described herein exhibited high $V_{oc}$ of 1.63 V and 1.46 V, respectively. Importantly, this high $V_{oc}$ was reproducible across fabricated devices. FIG. 10 illustrates a histogram of $V_{oc}$ across photovoltaic device 1 having a D/A1 active layer. As provided in FIG. 10, all 57 of the fabricated photovoltaic devices exhibited $V_{oc}$ in the range of 1.60 V to 1.65 V. Additionally, photovoltaic active layers comprising devices 1 and 2 exhibited greater than 70% average transmittance of light in the visible region of the electromagnetic spectrum as illustrated in FIG. 11.

Example 2

Photovoltaic Device Active Area Scalability

Figure 12A:
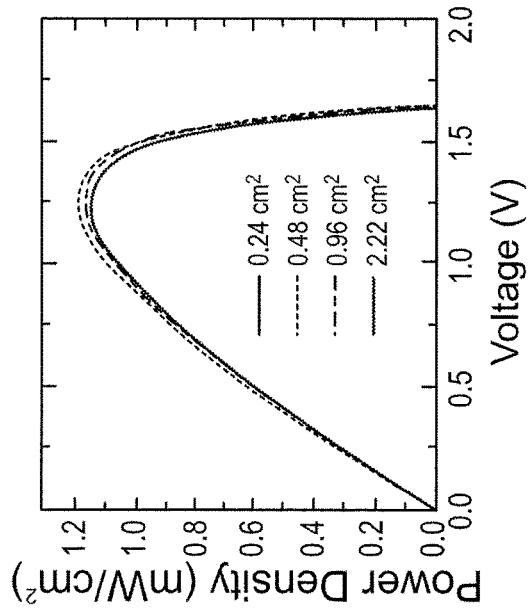
FIG. 12A illustrates J-V characteristics of photovoltaic devices according to some embodiments.
Figure 12B:
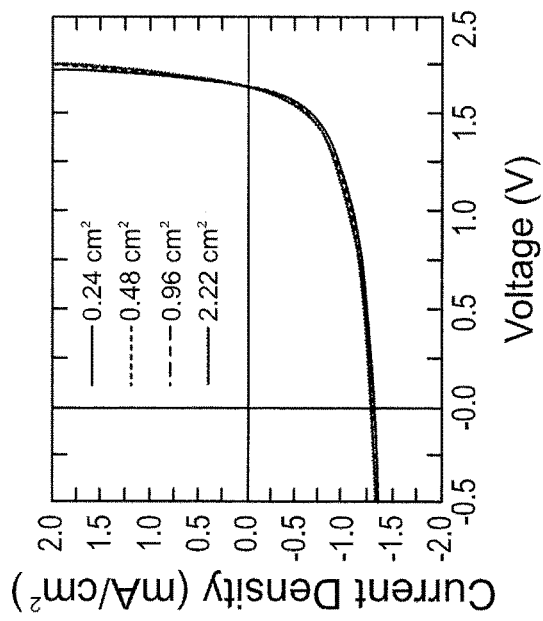
FIG. 12B illustrates power density profiles of photovoltaic devices according to some embodiments.
Figure 12C:
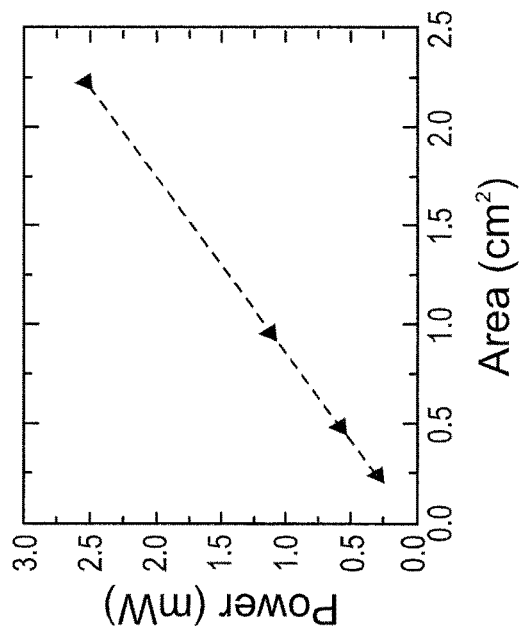
FIG. 12C illustrates a linear relationship between photovoltaic device power production and active area according to some embodiments.

To fabricate cells with larger active areas, ITO-coated glass substrates (20 Ω/square) having dimensions 23 mm×27 mm were patterned with an ITO strip having dimensions 12 mm×27 mm. Photomasks with varying sizes were used during aluminum top electrode deposition to define device active areas of 0.24, 0.48, 0.96 and 2.22 cm². Fabrication of the photovoltaic devices was completed as set forth in Example 1. FIGS. 12A and 12B illustrate J-V characteristics and power density profiles of D/Al planar heterojunction cells with the increasing active areas of 0.24, 0.48, 0.96, and 2.22 cm². The photovoltaic devices produce photocurrent that scales with active area. At constant photovoltage and fill factor, power production increases linearly with active area for the photovoltaic cells as illustrated in FIG. 12C.

Figure 13:
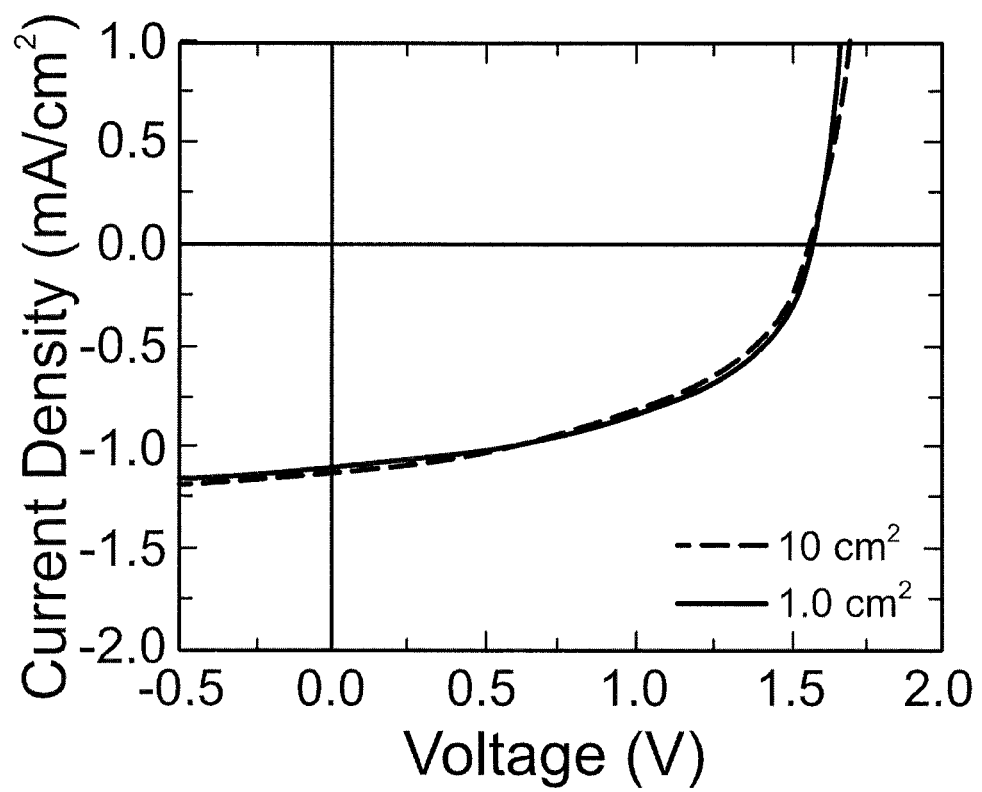
FIG. 13 illustrates J-V characteristics of a 1 $cm^2$ device and 10 $cm^2$ device having the same photovoltaic construction according to some embodiments.

The substrates used to prepare the 10 cm² devices were obtained by a multi-step patterning process. ITO-coated glass sheets (20 Ω/square) were cut into 5 cm×5 cm squares and cleaned by sonication in soap and deionized water, followed by deionized water, acetone, isopropanol, and dried with nitrogen. Photolithography was then performed to define the bottom electrode and the 30-nm thick Ag-grid current collector. In order to create a smooth surface for device layers, the Ag-grid substrates were augmented with a PEDOT:PSS layer doped with 5 vol % dimethyl sulfoxide per literature (See, Meng et al., *Nat. Commun.* 7, 10214, 2016). The PEDOT:PSS layer was spin-coated atop the patterned substrates at 4000 rpm (1000 rpm ramp) for 40 sec and then annealed at 140° C. for 30 minutes in a glovebox before being transferred to an evaporator chamber for deposition of devices layers as outlined in Example 1. FIG. 13 illustrates J-V characteristics of a 10 cm² device and 1 cm² device having the same photovoltaic construction. As provided in FIG. 13, J-V characteristics of the 1 cm² and 10 cm² devices are identical indicating scalability without performance losses. The results of FIG. 13 are also indicative of the pinhole-free nature of the active layers that allow for areal scalability.

Example 3

Electrochromic Device

Figure 14:
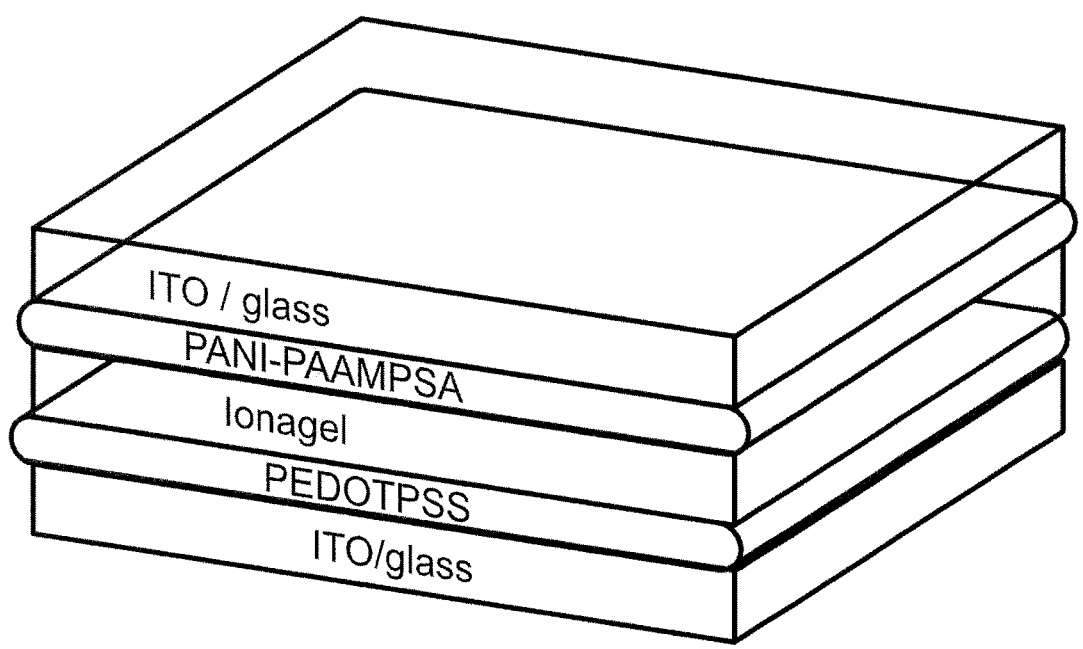
FIG. 14 illustrates an electrochromic assembly according to some embodiments.

An electrochromic assembly having architecture illustrated in FIG. 14 was fabricated as follows and characterized as follows. PANI-PAAMPSA was synthesized by template polymerization of aniline along PAAMPSA at 1:1 monomer-to-acid molar ratio in deionized water as described by Loo, et al., *J. Mater. Chem.* 17, 1268 (2007). A monolayer of 12-(phosphonododecyl)phosphonic acid (Sigma-Aldrich, 97%) was covalently bound to pre-cleaned ITO/glass by the tethering-by-aggregation-and-growth method as set forth in Schwartz et al., *J. Am. Chem. Soc.* 125, 16074-16080 (2003). A 5 wt % aqueous dispersion of PANI-PAAMPSA that were stirred for at least 10 days—or as-purchased PEDOT:PSS (Heraeus, Clevios pH 1000)—were spin-coated onto phosphonic acid-modified ITO/glass substrates. Electrochromic polymer thicknesses were varied by varying the spin-coating rates and the number of layers deposited. These films were solvent annealed in dichloroacetic acid (DCA, Sigma-Aldrich, 99%) as described by Loo, et al., *Proc. Natl. Acad Sci. U.S.A.* 107, 5712-7 (2010). DCA treatment is performed in order to eliminate any hysteresis in electrochromic switching due to ion-transport limitation. Film thicknesses were measured using a Dektak 3.21 profilometer.

Before assembling the electrochromic device, PEDOT:PSS was oxidized for 200 seconds at 0.9 V (vs. Ag/AgCl) and PANI-PAAMPSA was reduced for 200 seconds at −0.6 V (vs. Ag/AgCl) in pH 8, 100 mM phosphate buffer solution in order to bring PANI-PAAMPSA and PEDOT:PSS to opposite oxidation states. 1-Ethyl-3-methylimidazolium bis(trifluoromethylsulfonyl)imide (EMIM TFSI, Sigma-Aldrich, >97%) mixed with 5 wt % fumed silica (Sigma-Aldrich, 0.007 μm) was used as the gel electrolyte. Spectroelectrochemical experiments were performed to characterize the clear and the dark states of the electrochromic assembly.

A 2.25 cm² electrochromic assembly was prepared as described above. A 1.38 cm² solar cell with D/Al as the active layers was used to drive the switching of the electrochromic assembly. The PANI-PAAMPSA and PEDOT:PSS electrodes were connected to the cathode and anode of the solar cell, respectively, to achieve the dark state of the electrochromic assembly. The connections were reversed to access the clear state.

Figure 15:
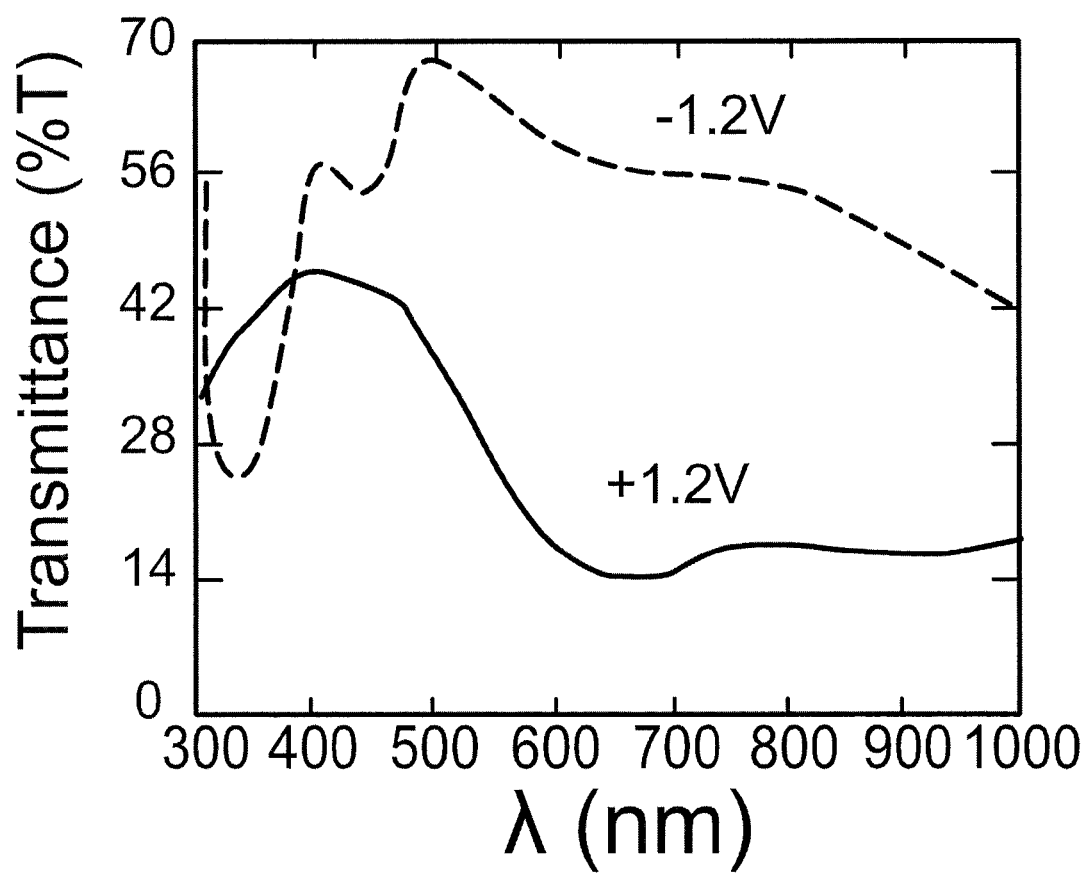
FIG. 15 illustrate optical transmittance of dark and light states of the electrochromic assembly of FIG. 14 when cycled between ±1.2 V.
Figure 16:
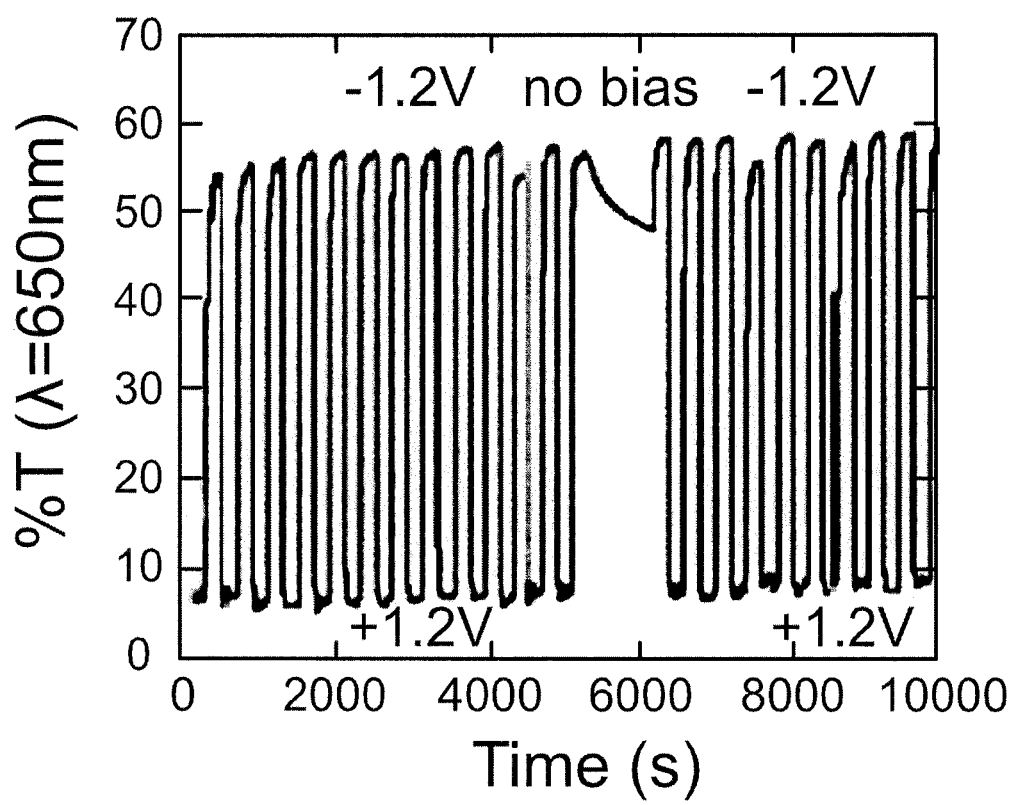
FIG. 16 illustrates stability of the transmission contrast of the electrochromic assembly of FIG. 14 when cycled between ±1.2 V.
Figure 17:
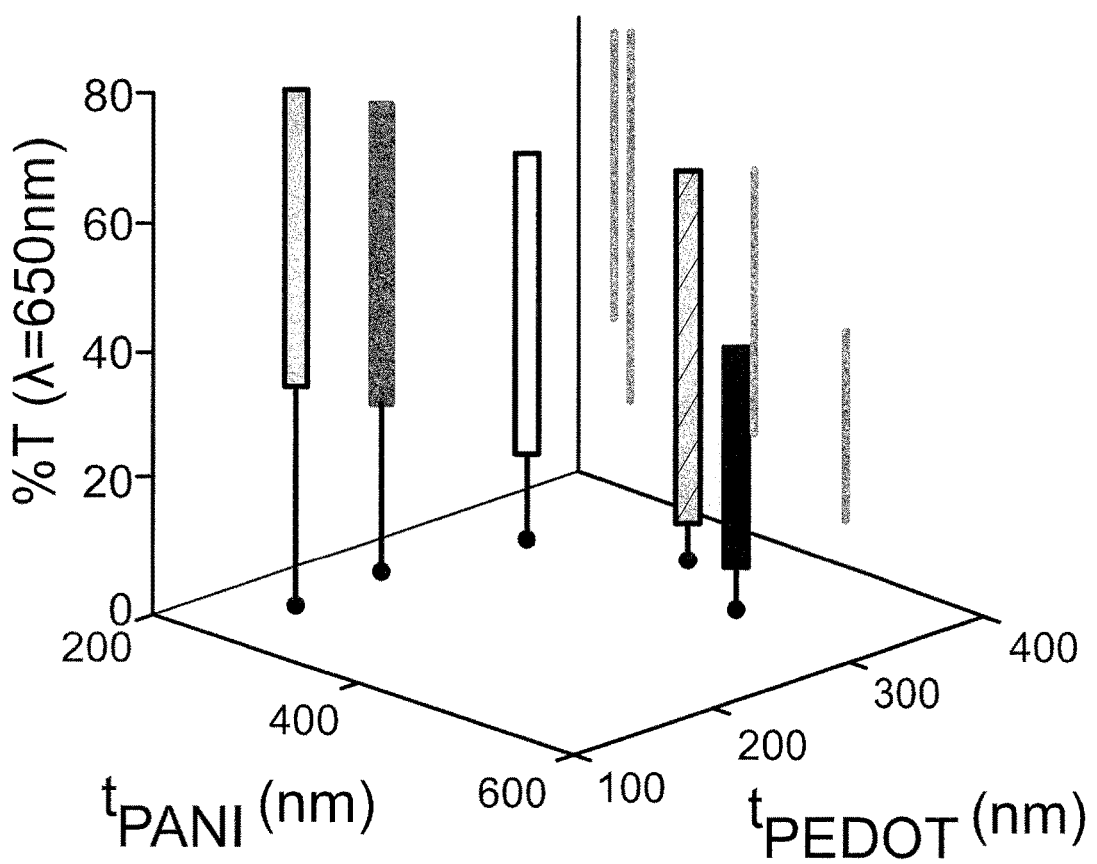
FIG. 17 illustrates tunability of the transmission contrast of electrochromic assemblies by varying the thicknesses of PANI-PAAMPSA and PEDOT:PSS according to some embodiments.

FIG. 15 illustrates the optical transmittance of the dark and light states of the electrochromic assembly when cycled between ±1.2 V. FIG. 16 illustrates stability of the transmission contrast of the electrochromic assembly when cycled between ±1.2 V. FIG. 17 illustrates tunability of the transmission contrast of electrochromic assemblies by varying the thicknesses of PANI-PAAMPSA and PEDOT:PSS (in all cases applied voltage is ±1.2 V).

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

The invention claimed is:

1. A single junction organic photovoltaic device comprising:
   an anode;
   a cathode; and
   an active layer residing between the anode and cathode, the active layer comprising an organic electron donor and an organic electron acceptor, wherein the single junction photovoltaic device generates an open circuit voltage ($V_{oc}$) of at least 1.4 V.

2. The single junction organic photovoltaic device of claim 1, wherein the $V_{oc}$ is at least 1.6 V.

3. The single junction organic photovoltaic device of claim 1, wherein the $V_{oc}$ is in the range of 1.4 V to 4 V.

4. The single junction organic photovoltaic device of claim 1, wherein the difference between the highest occupied molecular orbital (HOMO) of the organic electron donor and the lowest unoccupied molecular orbital (LUMO) of the organic electron acceptor is 1.7 eV to 4 eV.

5. The single junction organic photovoltaic device of claim 4, wherein the HOMO/LUMO difference is 2 eV to 4 eV.

6. The single-junction organic photovoltaic device of claim 1, wherein the active layer has an average transmittance in the visible light region of 60 percent to 100 percent.

7. The single junction organic photovoltaic device of claim 1, wherein peak absorbance of electromagnetic radiation by the active layer is in the range of 250 nm to 450 nm.

8. The single junction organic photovoltaic device of claim 1, wherein the active layer absorbs electromagnetic radiation in the range of 300 nm to 620 nm.

9. The single junction organic photovoltaic device of claim 1, wherein one or both of the organic electron donor and organic electron acceptor are selected from substituted coronenes.

10. The single junction organic photovoltaic device of claim 9, wherein the substituted coronenes comprise a coronene core annulated with heteroaromatic moieties.

11. The single junction organic photovoltaic device of claim 10, wherein the heteroaromatic moieties are selected from the group consisting of benzofuran, benzothiophene and pyridine.

12. The single junction organic photovoltaic device of claim 9, wherein the substituted coronenes comprise a coronene core annulated with halogenated aromatic moieties.

13. The single junction organic photovoltaic device of claim 1 further comprising a hole transport layer positioned between the anode and active layer.

14. The single junction organic photovoltaic device of claim 1, wherein the hole transport layer comprises a transition metal oxide.

15. The single junction organic photovoltaic device of claim 13 further comprising an electron transport layer positioned between the cathode and active layer.

16. The single junction organic photovoltaic device of claim 1, wherein the anode or cathode or both exhibit an average transmittance in the visible light region of 80 percent to 100 percent.

17. The single junction organic photovoltaic device of claim 1, wherein the anode or cathode or both exhibit an average transmittance in the infrared light region of 80 percent to 100 percent.

18. The single junction organic photovoltaic device of claim 1, wherein the active layer is pinhole free.

19. An electrochromic device comprising:
an electrochromic assembly; and
a single junction organic photovoltaic device in electrical communication with the electrochromic assembly for switching the electrochromic assembly between light and dark states via application of a photovoltage, the single junction organic photovoltaic device comprising an anode, a cathode and an active layer residing between the anode and cathode, the active layer comprising an organic electron donor and an organic electron acceptor, wherein the single junction photovoltaic device generates an open circuit voltage ($V_{oc}$) of at least 1.4 V.

20. The electrochromic device of claim 19, wherein the $V_{oc}$ is at least 1.6 V.

21. The electrochromic device of claim 19, wherein the difference between the HOMO of the organic electron donor and the LUMO of the organic electron acceptor is 1.7 eV to 4 eV.

22. The electrochromic device of claim 19, wherein the electrochromic assembly comprises a single electrochromic layer and a charge balancing layer.

23. The electrochromic device of claim 19, wherein the electrochromic assembly comprises a plurality of electrochromic layers.

24. The electrochromic device of claim 19, wherein one or more electrochromic layers of the electrochromic assembly comprise an electrochromic polymeric material.

25. The electrochromic device of claim 19, wherein one or more electrochromic layers of the electrochromic assembly comprise a metal oxide or mixed metal oxide.

26. The electrochromic device of claim 19, wherein the single junction organic photovoltaic device is vertically integrated with the electrochromic assembly.

27. The electrochromic device of claim 26 further comprising one or more additional single junction organic photovoltaic devices vertically integrated with the electrochromic assembly.

28. The electrochromic device of claim 19, wherein the single junction organic photovoltaic device is spaced apart from the electrochromic assembly.

29. The single junction organic photovoltaic device of claim 1, wherein the, active layer comprises a layer of the organic electron donor contacting a layer of the organic electron acceptor.

* * * * *

UNITED STATES PATENT AND TRADEMARK OFFICE
CERTIFICATE OF CORRECTION

PATENT NO. : 10,476,018 B2
APPLICATION NO. : 15/577965
DATED : November 12, 2019
INVENTOR(S) : Yueh-Lin Loo et al.

It is certified that error appears in the above-identified patent and that said Letters Patent is hereby corrected as shown below:

On the Title Page

Title is incorrect. Correct Title is:
"SINGLE-JUNCTION ORGANIC PHOTOVOLTAIC DEVICES HAVING HIGH OPEN-CIRCUIT VOLTAGES AND APPLICATIONS THEREOF"

Signed and Sealed this
Thirty-first Day of December, 2019

Andrei Iancu
*Director of the United States Patent and Trademark Office*